United States Patent [19]
Interrante et al.

[11] Patent Number: 6,037,193
[45] Date of Patent: Mar. 14, 2000

[54] HERMETIC SEALING OF A SUBSTRATE OF HIGH THERMAL CONDUCTIVITY USING AN INTERPOSER OF LOW THERMAL CONDUCTIVITY

[75] Inventors: Mario J. Interrante, New Paltz; Laertis Economikos, Wappingers Falls; Lester Wynn Herron, Hopewell Juction, all of N.Y.

[73] Assignee: International Business Machines Corporation, Armonk, N.Y.

[21] Appl. No.: 08/792,073

[22] Filed: Jan. 31, 1997

[51] Int. Cl.<sup>7</sup> ................................................ H01L 23/28
[52] U.S. Cl. ........................... 438/122; 438/106; 438/118
[58] Field of Search .................... 257/682, 687, 257/703, 704, 705, 710; 438/122, 121, 106, 118

[56] References Cited

U.S. PATENT DOCUMENTS

| | | | |
|---|---|---|---|
| 3,874,549 | 4/1975 | Hascoe | 257/704 |
| 4,020,987 | 5/1977 | Hascoe | 282/56 |
| 4,656,499 | 4/1987 | Butt | 257/704 |
| 4,827,082 | 5/1989 | Horiuchi et al. | 257/703 |
| 4,895,291 | 1/1990 | Ozimek et al. | 228/121 |
| 4,985,753 | 1/1991 | Fujioka et al. | 257/704 |
| 5,095,359 | 3/1992 | Tanaka et al. | 257/703 |
| 5,138,426 | 8/1992 | Umeda et al. | 257/701 |
| 5,159,432 | 10/1992 | Ohkubo et al. | . |
| 5,414,300 | 5/1995 | Tozawa et al. | 257/704 |
| 5,446,316 | 8/1995 | Temple et al. | 257/704 |
| 5,463,248 | 10/1995 | Yano et al. | . |
| 5,569,958 | 10/1996 | Bloom | 257/703 |
| 5,639,014 | 6/1997 | Damiano et al. | 228/254 |
| 5,818,699 | 10/1998 | Fukuoka | 257/704 |
| 5,945,735 | 8/1999 | Economikos et al. | 257/710 |

FOREIGN PATENT DOCUMENTS

| | | | |
|---|---|---|---|
| 5-144956 | 6/1993 | Japan | 257/710 |
| 5-343548 | 12/1993 | Japan | 257/710 |

*Primary Examiner*—Donald L. Monin, Jr.
*Assistant Examiner*—Michael Dietrich
*Attorney, Agent, or Firm*—Aziz M. Ahsan

[57] ABSTRACT

The present invention relates generally to a new process for hermetically sealing of a high thermally conductive substrate, such as, an aluminum nitride substrate, using a low thermally conductive interposer and structure thereof. More particularly, the invention encompasses a hermetic cap which is secured to an aluminum nitride substrate using the novel thermal interposer. The novel thermal interposer basically comprises of layers of relatively high thermal conductive metallic materials sandwiching a core layer of low thermal conductive metallic material.

15 Claims, 1 Drawing Sheet

HERMETIC SEALING OF A SUBSTRATE OF HIGH THERMAL CONDUCTIVITY USING AN INTERPOSER OF LOW THERMAL CONDUCTIVITY

CROSS-REFERENCE TO RELATED PATENT APPLICATION

This Patent Application is related to U.S. Pat. No. 5,945,735, filed on Jan. 31, 1997, entitled "HERMETIC SEALING OF A SUBSTRATE OF HIGH THERMAL CONDUCTIVITY USING AN INTERPOSER OF LOW THERMAL CONDUCTIVITY", assigned to the assignee of the instant Patent Application, and the disclosure of which is incorporated herein by reference.

FIELD OF THE INVENTION

The present invention relates generally to a new process for hermetically sealing of a high thermally conductive substrate, such as, an aluminum nitride substrate, using a low thermally conductive interposer and structure thereof. More particularly, the invention encompasses a hermetic cap which is secured to an aluminum nitride substrate using the novel thermal interposer. The novel thermal interposer basically comprises of layers of relatively high thermal conductive metallic materials sandwiching a core layer of low thermal conductive metallic material.

BACKGROUND OF THE INVENTION

Semiconductor devices are becoming smaller and more dense with the evolution of new technology. However, increases in circuit density produce a corresponding increase in overall chip requirements to remain competitive. Chip manufacturers are therefore challenged to improve the quality of their products by identifying new ways of improving their manufacturing processes and material used to make their products. Whereas significant improvements have been made to eliminate or reduce process variability. Process improvements alone are not sufficient to improve both yield and reliability. Therefore, new processes and structures must be discovered in order for the semiconductor manufactures to remain competitive.

U.S. Pat. No. 4,020,987 (Hascoe) discloses a thick alloy core having upper and lower thin alloy coatings, which is punched to form a punched solder preform ring for use in hermetically sealing a container.

U.S. Pat. No. 5,159,432 (Ohkubo) discloses a package for a semiconductor device which uses an aluminum nitride (AlN) substrate, which has good heat radiating properties, and, which is sealed hermetically with low melting point glass.

U.S. Pat. No. 5,463,248 (Yano) teaches a semiconductor package comprising an aluminum nitride substrate having a semiconductor element mounted thereon, and a ceramic sealing member or cap secured thereto using a sealing glass and a fixing glass.

The above-mentioned processes all require furnace reflow of the entire package for hermetic sealing.

However, a resistance soldering process known as seam sealing can also be used to hermetically seal (solder/braze) metallic lids onto ceramic packages. These conventional alumina substrates, such as, based on ceramics or glass-ceramics packages, have relatively poor thermal conductivity, making it easy to do the localized heating required to reflow the solder/braze joint using the seam seal process.

However, aluminum nitride (AlN) substrates, by design have a relatively high thermal conductivity, making it extremely difficult to maintain sufficient localized heating to complete the wetting/reflow of braze/solder joint between a thermal cap or lid and the seal ring metallization on the AlN substrate.

The inventors however have discovered a way to overcome the problem of securing a thermal cap or lid to a relatively high thermal conductivity substrate, such as, for example, an AlN substrate, using an innovative seal ring thermal interposer between the thermal cap or lid and the AlN substrate, while accommodating the electronic devices mounted on the surface of the AlN substrate.

PURPOSES AND SUMMARY OF THE INVENTION

The invention is a novel process for hermetically sealing a high thermal conductivity substrate, such as, an aluminum nitride substrate, using a thermal interposer, and structure thereof.

Therefore, one purpose of this invention is to have a process and a structure that will provide a hermetic cap which is secured to a high thermal conductivity substrate, such as, an aluminum nitride substrate using the novel thermal interposer.

Another purpose of this invention is to provide for a novel thermal interposer which basically comprises of layers of high thermal conductive metallic material sandwiching a core layer of low thermal conductive metallic material.

Still another purpose of this invention is to have the TCE (Thermal Coefficient of Expansion) of the interposer core match the TCE of the AlN substrate.

Yet another purpose of this invention is to provide the core layer of the thermal interposer with relatively low thermal conductivity.

Still yet another purpose of the invention is to have a lid or thermal cap which comprises of a material that has relatively low thermal conductivity, and which matches the TCE of the AlN substrate and provides a hermetic seal.

Therefore, in one aspect this invention comprises a process for securing a low thermally conductive cap to a high thermally conductive substrate, comprising the steps of:

(a) securing at least one seal band to the periphery of said high thermally conductive substrate, wherein said seal band forms a picture frame on the surface of said high thermally conductive substrate, (b) securing at least one first high thermally conductive material to said at least one seal band, (c) securing at least one low thermally conductive material to said at least one first high thermally conductive material, (d) securing at least one second high thermally conductive material to said at least one low thermally conductive material, and (e) securing said low thermally conductive cap to said at least one second high thermally conductive material.

In another aspect this invention comprises a semiconductor package comprising, a low thermally conductive cap secured to a high thermally conductive substrate using a seal band, a first high thermally conductive material, a low thermally conductive material and a second high thermally conductive material.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

Figure 1:
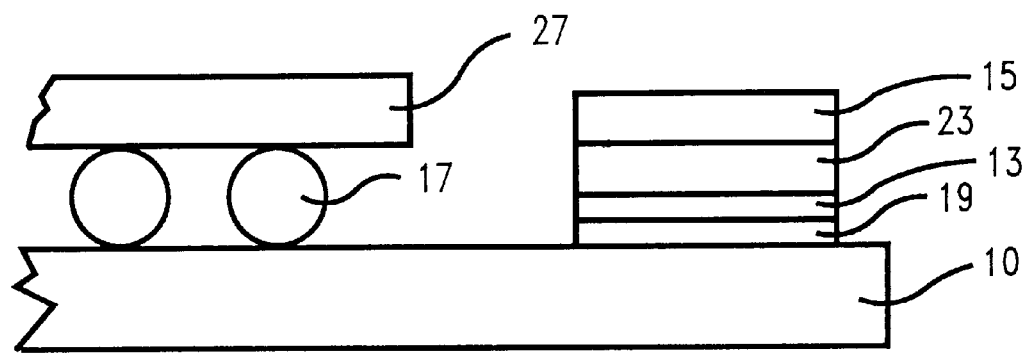
FIG. 1, illustrates an embodiment of this invention where an inventive thermal interposer has been secured to an AlN substrate.

Hermetic sealing of aluminum nitride (AlN) substrates is typically done by furnace reflow methods. In the furnace reflow method, basically, the entire AlN package is placed inside a furnace.

The temperature of the furnace is then raised to the reflow temperature of the solder/braze which is used for sealing of the AlN package. Solder/braze temperatures commonly used in the furnace reflow method are in the range from about 225° C. to about 400° C. This high reflow temperature has serious consequences for surface mount electronic elements or components, such as, for example, semiconductor chips, decoupling capacitors, any thin film wiring, to name a few.

Other problems that can happen using the furnace reflow method are reliability of the attached components due to subsequent reflow, as well as any thermal degradation.

Seam sealing is another process that can be used. Seam sealing uses resistance welding to reflow solder/braze that is in the immediate localized area of the electrode contact.

One seam sealing process involves the use of an electrode wheel which is positioned close to the outside lid-seal region. The electrode wheel is then moved around the lid-seal region and by using the high concentration of temperature at the lid-seal region the braze or solder reflows, and the lid is subsequently sealed at the lid-seal region.

Conventional seam sealing of metal lids is generally done on low thermal conductivity substrates such as alumina and glass-ceramic. The pulse current applied to the electrodes is in short time intervals (millisecs).

However, when this conventional seam sealing process was applied to a substrate with high thermal conductivity, such as, aluminum nitride, the heat dissipation into the substrate body was so rapid that incomplete reflow and wetting of the braze/solder to the substrate seal band occurred.

However, the inventors have discovered that a high thermally conductive substrate, such as, an AlN substrate can be hermetically sealed by the use of the seam sealing process in conjunction with a low thermal conductivity interposer. For the ease of understanding the high thermally conductive substrate may be referred to by the specific example of the AlN substrate.

It was also found that the inventive seam sealing process had no subsequent reliability concerns due to its localized heating on an AlN substrate, because, the low thermal conductivity of the interposer allowed for the heat to be concentrated in the lid-seal region only.

The discovery includes the use of a thermal interposer, which preferably matches the thermal coefficient of expansion (TCE) of the high thermal conductivity substrate, such as, an aluminum nitride substrate. With the use of the thermal interposer the thermal dissipation into the aluminum nitride substrate, was significantly reduced, such that complete melting of the solder/braze and subsequent wetting of the substrate seal ring was achieved. The thermal interposer must have relatively poor thermal conduction.

FIG. 1, illustrates an embodiment of this invention where an inventive thermal interposer 23, has been secured to a high thermally conductive substrate 10, such as, an AlN substrate 10. On the AlN substrate 10, at least one first high thermal conductivity material layer 13, such as, for example, a solder/braze layer 13, is first formed on a seal band or ring 19, such as, for example, a nickel/gold plated metallized seal ring 19, on the aluminum nitride substrate 10. The high thermally conductive substrate 10, preferably, has a thermal conductivity in the range from about 140 W/mK to about 210 W/mK (Watts/meter Kelvin).

The seal band or ring 19, is formed at the outer periphery of the AlN substrate 10, in a band-like or a picture frame manner. Preferred material for the seal band layer 19, are selected from a group comprising nickel/gold, gold/tin, tin/silver, or alloys thereof, to name a few.

Preferred material for the first high thermal conductivity material layer 13, or the solder/braze layer 13, are selected from a group comprising gold/tin, tin/silver, tin/lead, or alloys thereof, to name a few.

At least one thermal interposer core 23, is then formed over the first solder/braze layer 13. Preferred material for the thermal interposer 23, are selected from a group comprising nickel/iron, alloy 42, alloy 45, or alloys thereof, to name a few. Preferably, the low thermally conductive interposer 23, has a thermal conductivity in the range from about 14 W/mK to about 20 W/mK.

The thermal interposer 23, can be made using Alloy 42, which has a TCE (Thermal Coefficient of Expansion) that is closely matched to that of the AlN substrate 10, or any other similar material can be used as the thermal interposer 23.

Surface mount electronic component 27, such as, for example, decoupling capacitor or semiconductor chip 27, can be attached to the AlN substrate 10, by methods well known in the art, such as, using interconnections 17, such as, solder balls 17. The electronic components 27, can be mounted at anytime on the AlN substrate 10, as along as it is prior to the securing of the lid or cap 20, shown in FIG. 2. However, the AlN substrate 10, could also have other electronic components, which for the ease of understanding have not been shown, such as, thin film wiring, etc.

At least one second high thermal conductivity material layer 15, such as, a solder/braze layer 15, is formed over the thermal interposer 23. Preferred material for the second solder/braze layer 15, are selected from a group comprising gold/tin, tin/silver, tin/lead, or alloys thereof, to name a few.

The thermal conductivity of the first thermally conductive material 13, or the second thermally conductive material 15, preferably, is in the range from about 50 W/mK to about 60 W/mK.

Figure 2:
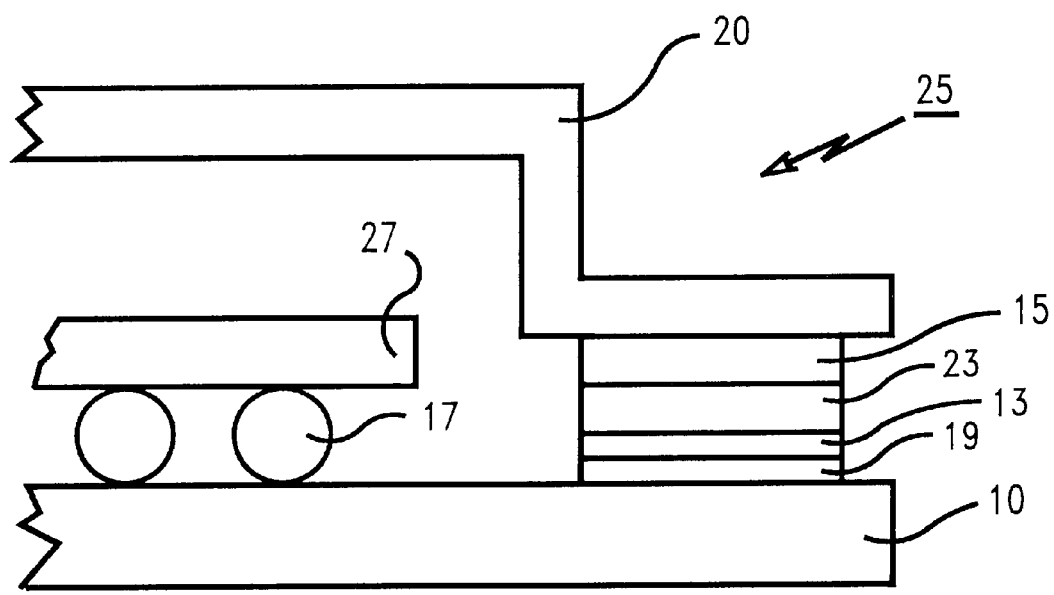
FIG. 2, illustrates a completed embodiment of this invention where a cap has been secured to the AlN substrate via the inventive thermal interposer.

FIG. 2, illustrates a AlN package 25, which is a completed embodiment of this invention where a thermal cap or lid 20, such as, a low thermally conductive cap 20, has been secured to the AlN substrate 10, via the inventive thermal interposer 23, using the conventional seam sealing process. The thermal cap or lid 20, is preferably an Alloy 42 lid 20.

The lid 20, after it is properly seam sealed onto the thermal interposer 23, creates the hermetic electronic package 25.

It was found that by pre-brazing the thermal interposer 23, with the solder/braze layer 13, onto the seal band 19, the heat dissipation into the aluminum nitride (AlN) substrate 10, was significantly reduced during the seam sealing process.

It was noticed that the thermal interposer 23, also blocked the dissipation of thermal energy into the AlN substrate 10, for a long enough time to allow for completion of the wetting to the seal band 19. This allowed to get reproducible hermeticity for the electronic package 25.

Furnace reflow can be used with this process to secure the first solder/braze layer 13, and the interposer core 23, to the AlN substrate 10, via the seal band 19. The furnace reflow of the first solder/braze layers 13, insured good wetting/joining of the thermal interposer 23, to the seal ring 19, on the AlN substrate 10. Optimum furnace reflow results were achieved using an atmosphere of nitrogen and hydrogen. Voids in the solder/braze were minimized and the top surface of the thermal interposer 23, remained clean for the seam sealing process.

It was discovered that the thermal interposer 23, not only significantly slowed down the heat transfer into the AlN substrate 10, allowing for reproducible hermetic sealing, but also acted as a stress reducer at the substrate/braze interface.

The use of the thermal interposer 23, pre-brazed onto the seal ring 19, on the AlN substrate 10, also allows for uniform localized reflow of the braze preform 15, which is attaches the thermal cap or lid 20, to the interposer 23, during the seam seal process.

As stated earlier that this happens because the heat dissipation into the AlN 10, is substantially decreased due to the relatively poor thermal conductivity of the thermal interposer 23. This allows for the complete wetting of the interposer 23, and lid surfaces 20, by the braze preform 15, insuring good hermeticity.

EXAMPLES

The following examples are intended to further illustrate the invention and are not intended to limit the scope of the invention in any manner.

EXAMPLE 1

Aluminum nitride packages without the thermal interposer 23, where prepared using the standard seam seal process and tested for hermeticity. All of these packages failed in the liquid to liquid (−65° C. to 150° C.) test.

Upon further testing it was discovered that in trying to seam seal the metal lid 20, onto AlN substrate 10, that as soon as any of the braze or solder material got to it's liquidus state a perfect thermal conduction path was created for the rapid dissipation of heat into the AlN substrate 10, resulting in an incomplete filleting or wetting between the seal band 19, and the interposer 23. The TCE of the AlN substrate 10, was about 3.4 E-6 ppm.

EXAMPLE 2

Aluminum nitride packages 25, with the thermal interposer 23, where prepared using the seam seal process of this invention and tested for hermeticity, using the liquid to liquid (−65° C. to 150° C.) test. The AlN packages 25, with the thermal interposers 23, were still hermetic even after over 2,000 cycles.

The TCE of Alloy 42 used was about 4.3 E-6 ppm, while the TCE of the AlN substrate 10, was about 3.4 E-6 ppm.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for securing a low thermally conductive cap to a high thermally conductive substrate, comprising the steps of:
    (a) securing at least one seal band to the periphery of said high thermally conductive substrate, wherein said seal band forms a picture frame on the surface of said high thermally conductive substrate,
    (b) securing at least one first high thermally conductive material to said at least one seal band,
    (c) securing at least one low thermally conductive material to said at least one first high thermally conductive material,
    (d) securing at least one second high thermally conductive material to said at least one low thermally conductive material, and
    (e) securing said low thermally conductive cap to said at least one second high thermally conductive material.

2. The process of claim 1, wherein said seal band is selected from a group consisting of nickel/gold, gold/tin, tin/silver and alloys thereof.

3. The process of claim 1, wherein said first high thermally conductive material is selected from a group consisting of gold/tin, tin/silver, tin/lead and alloys thereof.

4. The process of claim 1, wherein said second high thermally conductive material is selected from a group consisting of gold/tin, tin/silver, tin/lead and alloys thereof.

5. The process of claim 1, wherein said low thermally conductive material is selected from a group consisting of nickel/iron, alloy 42, alloy 45 and alloys thereof.

6. The process of claim 1, wherein material for said low thermally conductive cap is selected from a group consisting of nickel/iron, alloy 42, alloy 45 and alloys thereof.

7. The process of claim 1, wherein said high thermally conductive substrate is an aluminum nitride substrate.

8. The process of claim 1, wherein said first high thermally conductive material is secured to said seal band on said high thermally conductive substrate using a furnace reflow process.

9. The process of claim 1, wherein said low thermally conductive cap is secured to said second high thermally conductive material using a seam sealing process.

10. The process of claim 1, wherein said low thermally conductive cap forms a hermetic seal with said high thermally conductive substrate.

11. The process of claim 1, wherein at least one semiconductor element is secured to said high thermally conductive substrate.

12. The process of claim 1, wherein at least one semiconductor element is secured to said high thermally conductive substrate, and wherein said semiconductor element is selected from a group consisting of semiconductor chip, thin film wiring and decoupling capacitor.

13. The process of claim 1, wherein said high thermally conductive substrate has a thermal conductivity in the range from about 140 W/mK to about 210 W/mK.

14. The process of claim 1, wherein said low thermally conductive material has a thermal conductivity in the range from about 14 W/mK to about 20 W/mK.

15. The process of claim 1, wherein said first or said second high thermally conductive material has a thermal conductivity in the range from about 50 W/mK to about 60 W/mK.

* * * * *